(12) United States Patent
Ikushima (10) Patent No.: US 10,799,906 B2
(45) Date of Patent: Oct. 13, 2020

(54) DISCHARGE DEVICE AND DISCHARGE METHOD FOR LIQUID MATERIAL CONTAINING SOLID PARTICLES, AND COATING DEVICE

(71) Applicant: MUSASHI ENGINEERING, INC., Mitaka-shi, Tokyo (JP)

(72) Inventor: Kazumasa Ikushima, Tokyo (JP)

(73) Assignee: MUSASHI ENGINEERING, INC., Tokyo (JP)

( * ) Notice: Subject to any disclaimer, the term of this patent is extended or adjusted under 35 U.S.C. 154(b) by 169 days.

(21) Appl. No.: 15/746,108

(22) PCT Filed: Jul. 21, 2016

(86) PCT No.: PCT/JP2016/071342
§ 371 (c)(1),
(2) Date: Jan. 19, 2018

(87) PCT Pub. No.: WO2017/018304
PCT Pub. Date: Feb. 2, 2017

(65) Prior Publication Data
US 2018/0214903 A1    Aug. 2, 2018

(30) Foreign Application Priority Data

Jul. 24, 2015  (JP) ................................. 2015-146472

(51) Int. Cl.
*B05C 11/10*    (2006.01)
*B05D 7/24*    (2006.01)
(Continued)

(52) U.S. Cl.
CPC .......... *B05C 11/10* (2013.01); *B01F 11/0074* (2013.01); *B05C 5/0225* (2013.01);
(Continued)

(58) Field of Classification Search
CPC .............. B01F 11/0074; B01F 11/0071; B01F 15/0217; B01F 15/531; B01F 5/0683;
(Continued)

(56) References Cited

U.S. PATENT DOCUMENTS 3,122,272 A * 2/1964 Marsh ................... B44D 3/003
222/26
4,027,785 A * 6/1977 Edstrom ............. B01F 13/1055
222/135

(Continued)

FOREIGN PATENT DOCUMENTS

EP    2 481 485 A1    8/2012
EP    2781257 A1    9/2014
(Continued)

OTHER PUBLICATIONS

European search opinion, no date.*
(Continued)

*Primary Examiner* — Nicholas J. Weiss
(74) *Attorney, Agent, or Firm* — Westerman, Hattori, Daniels & Adrian, LLP (57) ABSTRACT

A device and a method of discharging a liquid in a state of solid particles being dispersed in the liquid with a minimum additional structure for dispersing the solid particles. A discharge device and an application device each include a storage container; a measuring unit having a measuring hole; a plunger disposed in the measuring hole; a nozzle; a selector valve having a first position at which the storage container and the measuring unit are communicated, and a second position at which the measuring unit and the nozzle are communicated; a plunger drive device; a selector valve drive device; and a discharge control device, wherein a discharge control program includes a filling stepinto the measuring hole; an ejection step; an inflow step causing the liquid material in the measuring hole to flow into the storage container; a discharge step; and a stirring step.

6 Claims, 7 Drawing Sheets

(51) Int. Cl.
  *B05D 1/26* (2006.01)
  *H01L 33/50* (2010.01)
  *B05C 5/02* (2006.01)
  *B01F 11/00* (2006.01)
  *B05C 17/005* (2006.01)

(52) U.S. Cl.
  CPC ........ *B05C 5/0233* (2013.01); *B05C 11/1034* (2013.01); *B05D 1/26* (2013.01); *B05D 7/24* (2013.01); *H01L 33/50* (2013.01); *B05C 5/0216* (2013.01); *B05C 17/00573* (2013.01)

(58) Field of Classification Search
  CPC ... B01F 5/0685; B05C 5/0225; B05C 5/0233; B05C 5/0216; B05C 11/1034; B05C 11/10; B05D 1/26
  See application file for complete search history.

(56) References Cited

U.S. PATENT DOCUMENTS

| | | | | |
|---|---|---|---|---|
| 6,164,499 A | * | 12/2000 | Chia | B05B 1/3026 |
| | | | | 222/380 |
| 7,387,681 B2 | | 6/2008 | Matsunaga et al. | |
| 8,763,860 B2 | * | 7/2014 | Ikushima | B67D 7/428 |
| | | | | 222/135 |
| 9,365,409 B2 | * | 6/2016 | Bressani | B01F 11/0074 |
| 10,556,207 B2 | * | 2/2020 | Ikushima | B05C 11/10 |
| 2003/0183654 A1 | * | 10/2003 | Voskuil | F16K 11/0876 |
| | | | | 222/144 |
| 2005/0150449 A1 | | 7/2005 | Matsunaga et al. | |
| 2009/0236366 A1 | | 9/2009 | Ikushima | |
| 2012/0217262 A1 | | 8/2012 | Ikushima | |
| 2012/0250451 A1 | | 10/2012 | Post et al. | |
| 2014/0252026 A1 | | 9/2014 | Ikushima | |
| 2014/0312064 A1 | | 10/2014 | Bressani | |

FOREIGN PATENT DOCUMENTS

| | | |
|---|---|---|
| JP | 8-80464 A | 3/1996 |
| JP | 2003-300000 A | 10/2003 |
| JP | 4774407 B2 | 9/2011 |
| WO | 2013/076649 A1 | 5/2013 |

OTHER PUBLICATIONS

Supplementary Partial Search Report dated Feb. 14, 2019, issued in counterpart EP Application No. 16 83 0409 (3 pages).

Extended (Supplementary) European Search Report dated Jun. 18, 2019, issued in counterpart EP application No. 16830409.5. (1 pages).

* cited by examiner

DISCHARGE DEVICE AND DISCHARGE METHOD FOR LIQUID MATERIAL CONTAINING SOLID PARTICLES, AND COATING DEVICE

TECHNICAL FIELD

The present invention relates to a device and a method of applying a liquid material, which contains solid particles, in a state of the solid particles being dispersed in the liquid material.

BACKGROUND ART

As a device of distributing various types of liquid materials in units of a predetermined amount, there is known a "dispenser" including a container in which the liquid material is stored, and discharging the liquid material in units of the predetermined amount from a nozzle, which is connected to the container, by the action of a gas pressure or a mechanical pressure. For example, Patent Document 1 discloses a dispenser, proposed by the applicant, in which the liquid material is filled in a measuring hole to be discharged by moving backward a plunger held in slide contact with an inner wall of the measuring hole, and the liquid material is discharged from a nozzle by moving the plunger forward.

In trying to discharge, among various types of liquid materials to be discharged by the dispenser, particularly a liquid mixed with solid particles having a greater specific gravity than the liquid, a problem arises in that the solid particles deposit at the bottom of a container and in a recess of a flow passage with the lapse of time. Furthermore, if dispersion of the solid particles is insufficient, a trouble of causing a discharge failure with clogging of the nozzle may occur. To avoid such a trouble, stirring is needed to keep a state of the solid particles being dispersed in the liquid.

Although the dispenser of the structure such as disclosed in Patent Document 1 has recently been used in many cases to discharge the liquid mixed with the solid particles, stirring means is additionally needed because the dispenser disclosed in Patent Document 1 includes no means for stirring the liquid.

In general, a liquid is stirred by a stirrer disposed in association with a container. However, even when the stirrer is disposed in association with the container, it may often occur that the solid particles deposit in a tubing connecting the container and a discharge mechanism, and that the liquid cannot be discharged in a state of the solid particles being dispersed in the liquid. The following method and device have been proposed so far with intent to solve the above problems.

Patent Document 2 discloses a liquid discharge method including an adjustment step of applying a pressure of 0.001 MPa to 10 MPa to a liquid that contains solid particles and that is filled in at least one of two or more containers, and holding a liquid pressure in at least one remaining container at a level lower than the liquid pressure in the aforementioned container, thus causing the liquid to flow through a flow passage between or among the two or more containers, while adjusting a flow rate of the liquid in the flow passage by flow adjustment means, and a discharge step of discharging, through a valve, the liquid supplied from the flow passage.

Patent Document 3 discloses a discharge device for a liquid material containing filler, in which a discharge passage having a substantially uniform inner diameter and extending up to a discharge port is disposed at a lower end of a storage container for the liquid material containing filler, a valve including a rotating valve member provided with a through-passage is disposed near the discharge port, and a reciprocating pump is connected to the discharge passage at a position upstream of the valve.

CITATION LIST

Patent Documents

Patent Document 1: Japanese Patent No. 4774407
Patent Document 2: Japanese Patent Laid-Open Publication No. 2003-300000
Patent Document 3: Japanese Patent Laid-Open Publication No. H08-80464

SUMMARY OF INVENTION

Technical Problems

There has been a demand for technical means for stirring a liquid material containing solid particles with a simple device structure, and for discharging the liquid material in a state of the solid particles dispersed in the liquid material.

The device disclosed in Patent Document 2 has a complicated device structure because of including the two containers and needing the flow rate between the two containers to be adjusted. The device disclosed in Patent Document 3 also has a complicated device structure because of needing the pump for stirring the liquid material to be connected to the discharge passage. When a branch flow passage for dispersing the solid particles is provided in the flow passage through which the liquid material passes, a flow of the liquid material tends to stagnate at a branched point and to cause deposition of the particles.

In view of the above-described situations, an object of the present invention is to provide a device and a method of discharging a liquid, which contains solid particles, in a state of the solid particles being dispersed in the liquid material with a minimum additional structure for dispersing the solid particles.

Solution to Problems

A discharge device for a liquid material containing solid particles, according to the present invention, comprises a storage container in which the liquid material containing solid particles is stored; a measuring unit having a measuring hole into which the liquid material is filled; a plunger that is moved forward and backward in the measuring hole; a nozzle having a discharge port through which the liquid material is discharged; a selector valve having a first position at which the storage container and the measuring unit are communicated with each other, and a second position at which the measuring unit and the nozzle are communicated with each other; a plunger drive device that moves the plunger forward and backward; a selector valve drive device that changes over the first position and the second position of the selector valve; and a discharge control device including a processor and a memory in which a discharge control program is stored, wherein the discharge control program includes a filling step of operating the selector valve to the first position, moving the plunger backward, and filling the liquid material into the measuring hole; an ejection step of operating the selector valve to the second position, moving the plunger forward, and discharging the liquid material in the measuring hole from the discharge port; an inflow step of operating the selector valve to the first position, moving the plunger forward, and causing the liquid material in the measuring hole to flow into the storage container; a discharge step of successively executing the filling step and the ejection step; and a stirring step of successively executing the filling step and the inflow step.

In the above discharge device, the discharge control program may include a continuous stirring step of continuously performing the stirring step.

The above discharge device may further comprise a connection member including a connection flow passage that communicates the storage container and the measuring unit with each other, and a cross-sectional area of a connection portion between the connection flow passage and the storage container may be ¼ or less of a cross-sectional area of the storage container. In that case, preferably, the cross-sectional area of the connection portion between the connection flow passage and the storage container is 1/10 or less of the cross-sectional area of the storage container. More preferably, the connection flow passage is formed of a linear flow passage having substantially the same diameter from one end to the other end.

An application device according to the present invention comprises the above-described discharge device for the liquid material containing solid particles; a stage to which a workpiece is fixed; an XYZ drive mechanism that moves the stage and the discharge device relatively to each other; and an application control device including a processor and a memory in which an application control program is stored, wherein the application control program includes an application step of causing the discharge device to perform the discharge step and the stirring step while moving the stage and the discharge device relatively to each other by the XYZ drive mechanism in accordance with an application pattern.

The above application device may further comprise a conveying mechanism that conveys the workpiece received from a carrying-in zone to the stage and conveys the workpiece from the stage to a carrying-out zone, and the application control program may include an in-conveyance stirring step of causing the discharge control device to perform the stirring step once or more while the workpiece is conveyed by the conveying mechanism.

In the above application device, the application control device may include a timer that detects lapse of a certain time from last stirring operation or discharge operation, and the application control program may include a fixed-timing stirring step of causing the discharge control device to perform the stirring step once or more on condition that the timer detects the lapse of the certain time, and that there is a time to perform the stirring step until start of the next discharge step.

In the above application device, the application control program may include a periodic stirring step of periodically detecting timing at which there is a time to perform the stirring step until start of the next discharge step, and causing the discharge control device to perform the stirring step once or more at the detected timing.

The present invention further provides an application method using the above-described application device, wherein an application pattern is formed on the workpiece with the application control device executing the application control program.

In the above application method, the solid particles may include solid particles having a higher specific gravity than the liquid material. In that case, the solid particles may be LED phosphors.

Advantageous Effects of Invention

According to the present invention, the liquid material containing solid particles can be discharged in a state of the solid particles being dispersed in the liquid material with a minimum additional structure for stirring.

Furthermore, since the stirring is performed by reversing a flow of the liquid material in the same flow passage, deposition of the solid particles in the flow passage can be minimized.

DESCRIPTION OF EMBODIMENT

An embodiment for carrying out the present invention will be described below. It is assumed that a "liquid, material" used in this Description is a liquid material containing solid particles unless otherwise specified.

(1) Configuration

Figure 1:
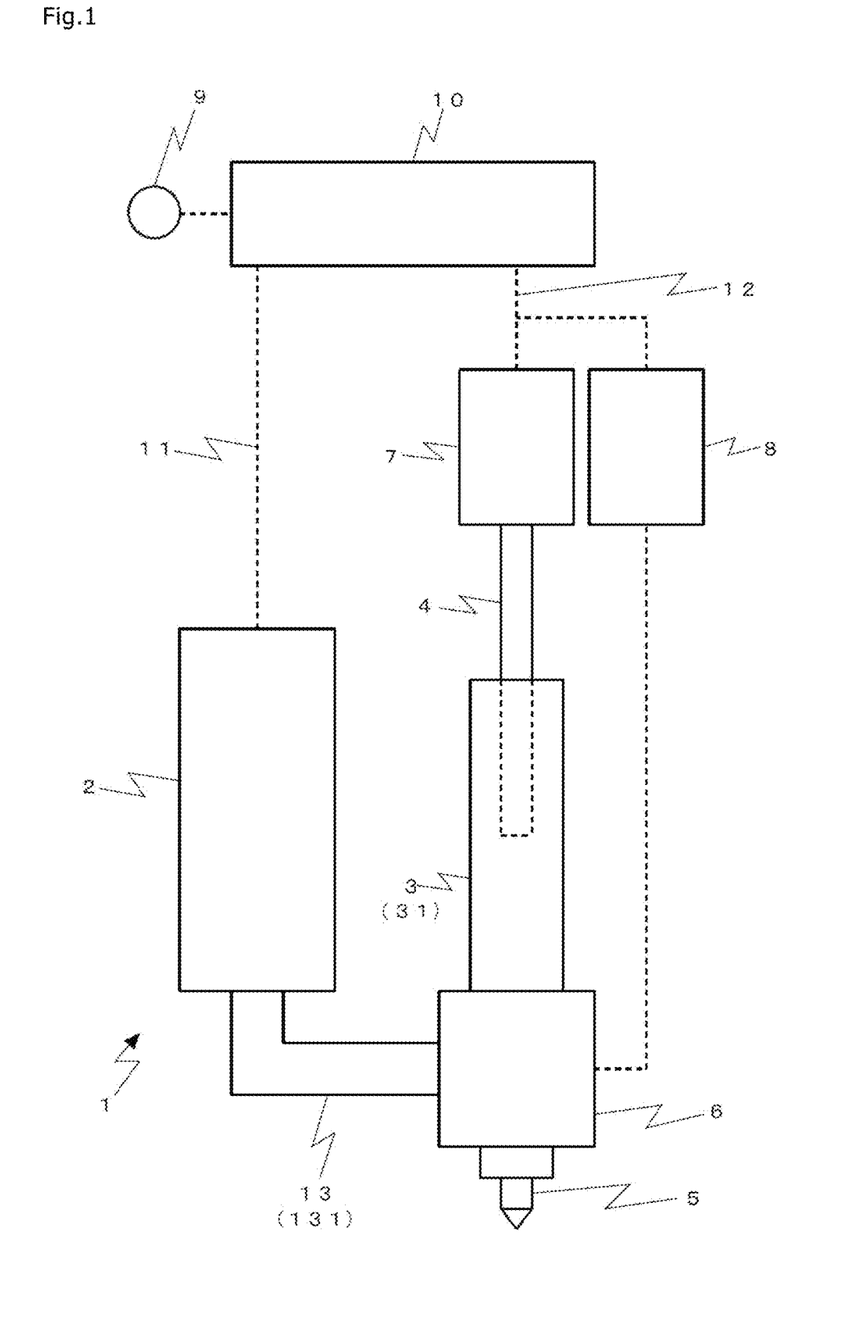
FIG. 1 is a schematic view of a discharge device according to an embodiment.

A discharge device 1 according to the embodiment of the present invention includes, as illustrated in FIG. 1, a storage container 2 in which a liquid material 14 is stored, a measuring unit 3 into which the liquid material 14 is filled, a plunger 4 that is moved forward and backward in the measuring unit 3, a nozzle 5 having a discharge port through which the liquid material 14 is discharged, a selector valve 6 that selectively establishes communication between the storage container 2 and the measuring unit 3 or communication between the measuring unit 3 and the nozzle 5, a plunger drive device 7 that moves the plunger 4 forward and backward, a selector valve drive device 8 that changes over a direction of the selector valve 6, and a discharge control device 10.

The storage container 2 is communicated with the measuring unit 3 through the selector valve 6, and the liquid material supplied to the measuring unit 3 is stored in the storage container 2. In the discharge device 1 in a preferred form, a compressed gas source 9 for supplying a compressed gas is connected, and the compressed gas under pressure adjusted by the discharge control device 10 is supplied to the storage container 2 through a tubing 11.

The measuring unit 3 is a cylindrical member having a measuring hole 31 that is a space where the liquid material to be discharged from the nozzle 5 is stored temporarily. The measuring hole 31 is a circular columnar space in which the plunger 4 is inserted in a state held in slide contact with an inner peripheral surface of the measuring unit 3. The measuring unit 3 is fixed to a selector block that constitutes the selector valve 6.

The plunger 4 is a rod-shaped member, and an outer peripheral surface of at least a tip portion of the plunger 4 is held in slide contact with the inner peripheral surface of the measuring hole 31. The plunger 4 is operated to move reciprocally by the plunger drive device 7.

The nozzle 5 includes a discharge flow passage and a discharge port both formed therein, and it is fixedly held under the selector valve 6. Respective centers of the discharge port, the discharge passage, and the measuring hole 31 are positioned on a linear line.

The selector valve 6 has a first position (see FIG. 2) at which the storage container 2 and the measuring unit 3 are communicated with each other, and a second position (see FIG. 4) at which the measuring unit 3 and the nozzle 5 are communicated with each other. The first position and the second position are changed over by the selector valve drive device 8 in accordance with a command from the discharge control device 10. The selector valve 6 is connected to the storage container 2 through a connection member 13 having a connection flow passage 131 therein.

In the embodiment, a stirring action during a later-described inflow operation is increased by setting a diameter of the connection flow passage 131 to be much smaller than that of the storage container 2. In other words, a cross-sectional area of the connection flow passage 131, which communicates the storage container 2 and the selector valve 6 with each other, taken along a plane perpendicular to a flow direction therein is set to be much smaller than that of the storage container 2 taken along a plane perpendicular to a flow direction therein. By setting the cross-sectional area of the connection flow passage 131 to be smaller, deposited solid particles are more apt to spread within the storage container and to come into a state more satisfactorily dispersed in the liquid material 14 when the liquid material is caused to flow into the storage container 2 during the inflow operation. The connection flow passage 131 may be constituted as a flow passage having a substantially uniform diameter from one end to the other end, or may include a throttling means (e.g., an orifice) at a connection portion 132 to the storage container 2. From the viewpoint of preventing deposition of the solid particles, however, the connection flow passage 131 is preferably constituted as a flow passage having the same diameter from one end to the other end.

The cross-sectional area of the connection flow passage 131 (of at least the connection portion 132), which communicate the storage container 2 and the selector valve 6 with each other, is set, for example, to be not more than ¼, preferably not more than ¹⁄₁₀, even preferably not more than ¹⁄₂₅, and most preferably not more than ¹⁄₆₄ of the cross-sectional area of the storage container 2.

The connection flow passage 131 may have a linear shape (I-shape), or a shape including a bent portion, such as an L-shape.

The shape of the connection member 13 is not limited to a tubular form such as illustrated, and the connection member 13 may be constituted as a block-like member including the connection flow passage 131 bored therein.

The discharge control device 10 includes a processor and a memory in which a discharge control program is stored.

When the discharge control device 10 executes the discharge control, operations of the above-described drive devices (7, 8) are controlled such that a discharge operation and a stirring operation, both described below, in the present invention are performed automatically. The discharge control device 10 is connected to the above-described drive devices (7, 8 via control wirings 12, and control signals are transferred via the control wirings 12. The discharge control device 10 in a preferred form includes a pressure adjustment mechanism that adjusts a pressure of the compressed gas supplied from the compressed gas source 9 and then supplies the compressed gas to the storage container 2.

(2) Discharge Operation (2-1) Filling Operation

When the liquid material is discharged from the nozzle 5 in the above-described discharge device 1, the following operations are performed in accordance with the discharge control program.

Figure 2:
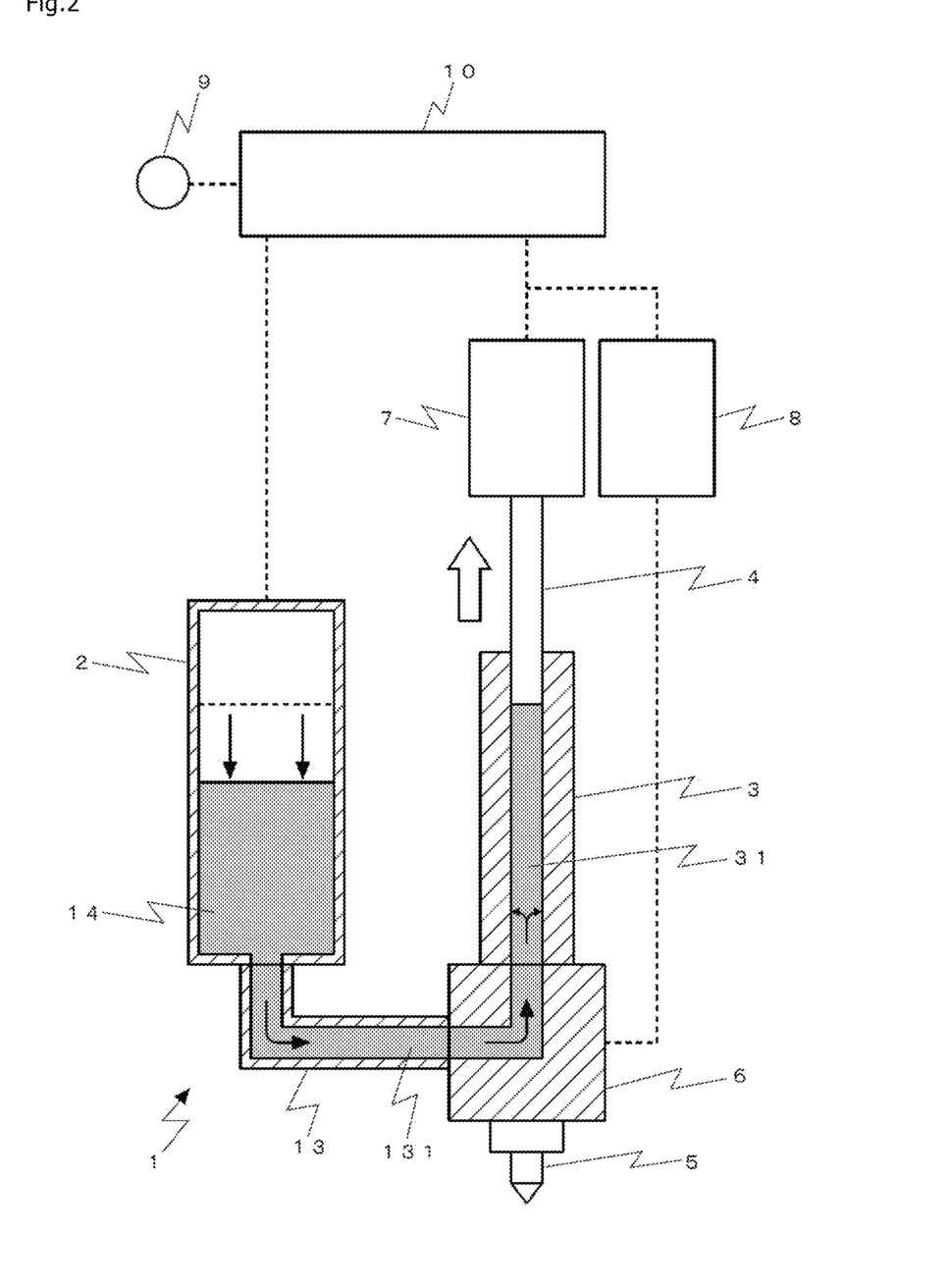
FIG. 2 is an explanatory view referenced to explain a filling operation performed in the discharge device according to the embodiment.

First, the selector valve drive device 8 is driven to change over the selector valve 6 to the first position at which the storage container 2 and the measuring unit 3 are communicated with each other, as illustrated in FIG. 2. Then, the plunger 4 is moved upward. With the action of the upward movement of the plunger 4, the liquid material 14 is filled into the measuring hole 31 via a lower end of the measuring unit 3 from the storage container 2 after passing through the connection member 13 and the selector valve 6, as denoted by black arrows in FIG. 2. In this Description, the above-described operation, illustrated in FIG. 2, is called a "filling operation". On that occasion, the compressed gas under the pressure adjusted by the discharge control device 10 may be supplied to the storage container 2, thereby applying pressure to the liquid material. This enables the filling operation to be performed more quickly and smoothly.

(2-2) Ejection Operation.

Figure 4:
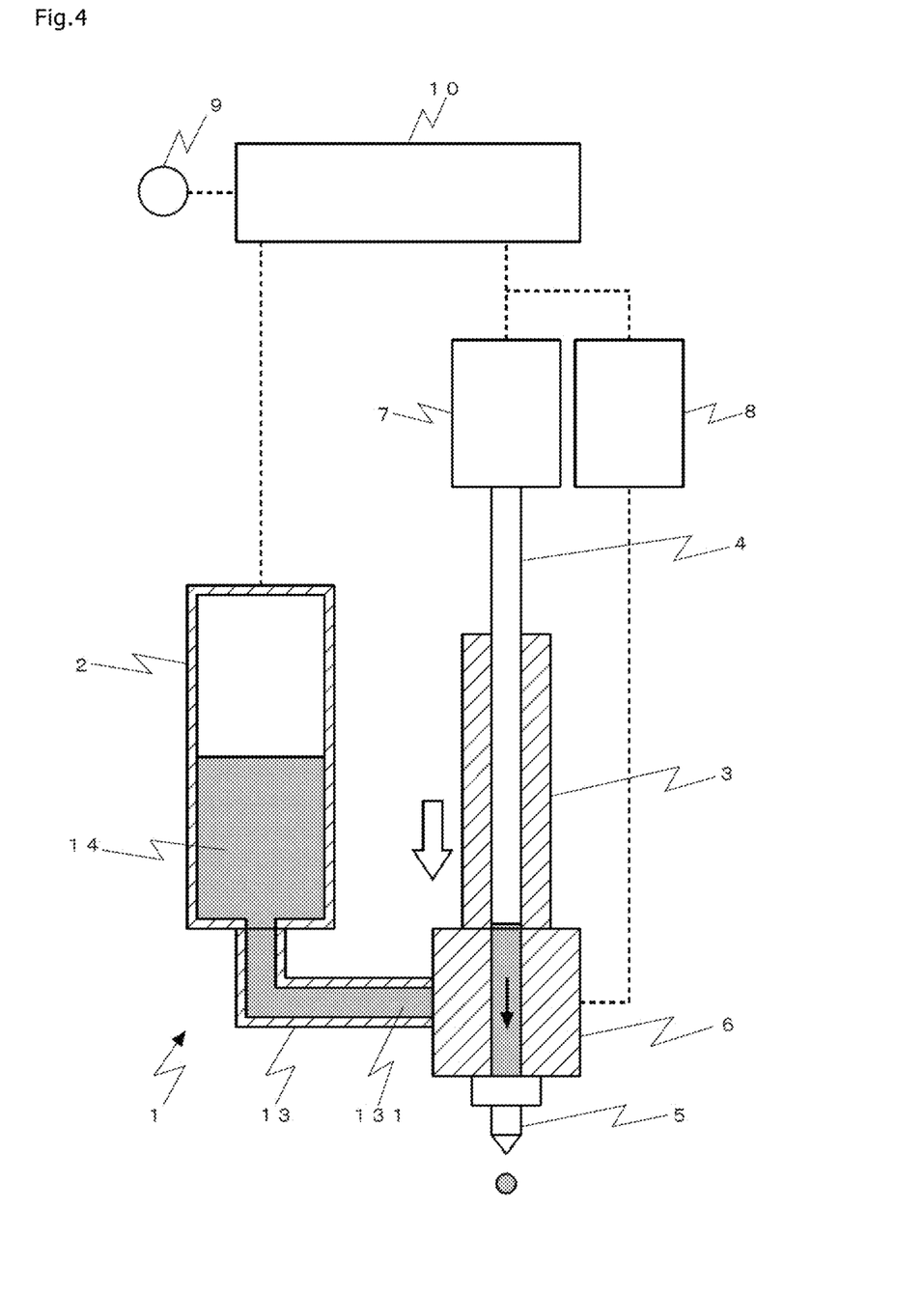
FIG. 4 is an explanatory view referenced to explain an ejection operation performed in the discharge device according to the embodiment.

After the completion of the filling operation, the selector valve drive device 8 is driven to change over the selector valve 6 to the second position at which the measuring unit 3 and the nozzle 5 are communicated with each other, as illustrated in FIG. 4. Then, the plunger drive device 7 is driven to move the plunger 4 downward, whereby the volume of the measuring hole 31 is reduced. Therefore, the liquid material 14 in the measuring hole 31 is pushed from the measuring unit 3 to the nozzle 5 through the selector valve 6, and is discharged from the nozzle 5, as denoted by a black arrow in FIG. 4. In this Description, the above-described operation, illustrated in FIG. 4, is called an "ejection operation".

The ejection operation is performed mainly in two operation patterns. In one operation pattern, the plunger 4 is intermittently moved downward multiple times, and multiple droplets are discharged successively. In the other operation pattern, the liquid material is discharged in a linear form onto a workpiece by moving the nozzle and the workpiece relatively to each other while the plunger 4 is continuously moved downward. An amount of the liquid material 14 capable of being discharged by moving the plunger 4 downward up to or close to the lower end of the measuring hole 31 is determined depending on an amount of the liquid material 14 filled into the measuring hole 31 in the filling operation. Stated in another way, an amount of the liquid material to be filled (or a distance through which the plunger 4 is to be moved upward) is set in consideration of a desired discharge amount.

In this Description, a combination of the above-described filling operation (FIG. 2) and the above-described ejection operation (FIG. 4) is called a "discharge" operation. A combination in which the filling operation is first performed and the ejection operation is then performed is assumed to be a basic discharge operation.

(3) Stirring Operation

When the liquid material is stirred in the above-described discharge device 1, the following operations are performed in accordance with the discharge control program. Here, a state after the end of the basic discharge operation, i.e., a state after the end of the ejection operation (state where the plunger has been moved downward), is assumed to be an initial state.

(3-1) Filling Operation

First, the filling operation of above (2-1) is performed. Inside the measuring hole 31 immediately after the filling operation, the solid particles in the liquid material are in a state stirred by a flow generated during the filling operation.

(3-2) Inflow Operation

Figure 3:
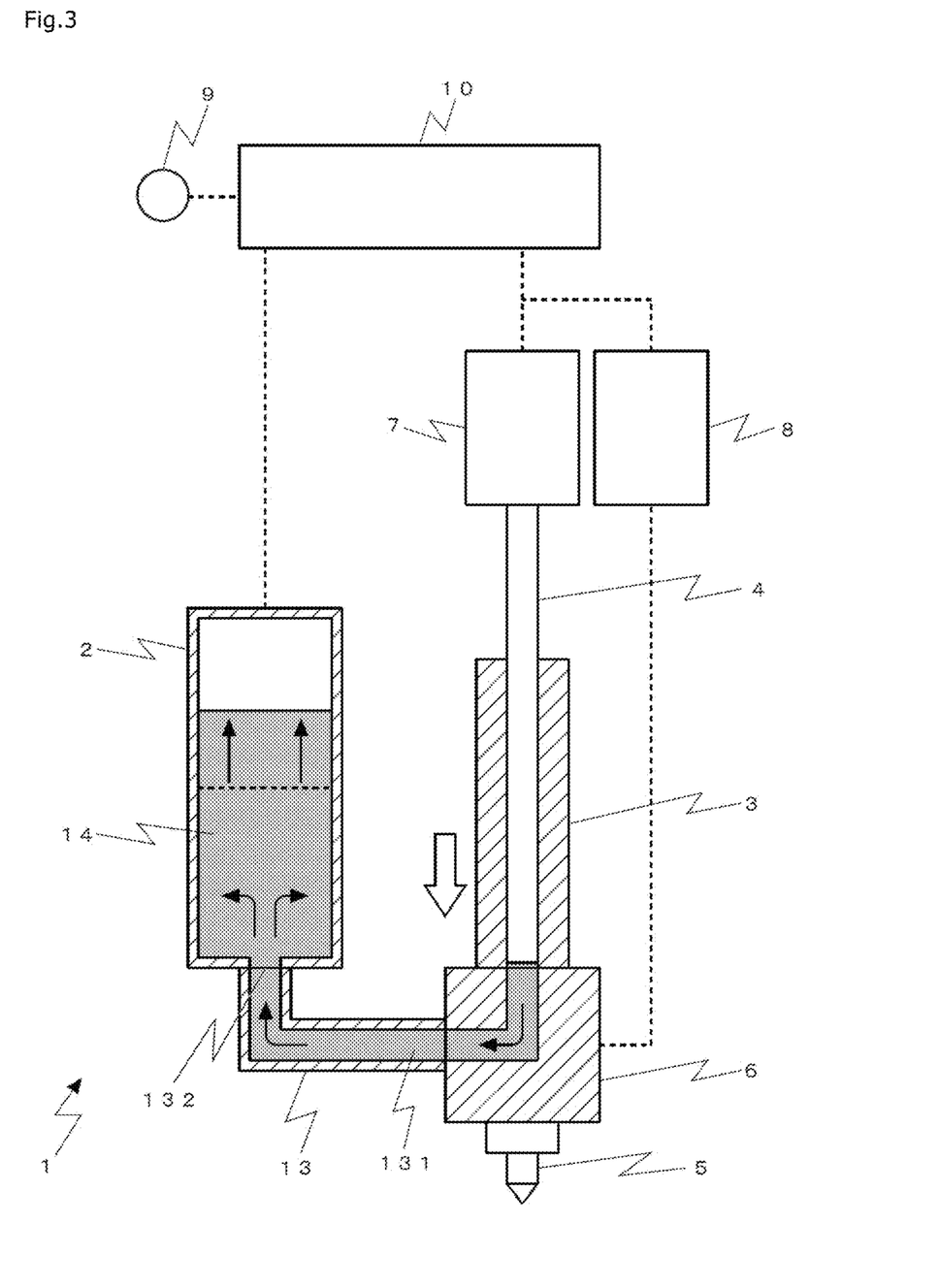
FIG. 3 is an explanatory view referenced to explain an inflow operation performed in the discharge device according to the embodiment.

As illustrated in FIG. 3, the selector valve 6 is held in the first position at which the storage container 2 and the measuring unit 3 are communicated with each other, without changing over the position of the selector valve 6. The plunger 4 is then moved downward to reduce the volume of the measuring hole 31. Thus, the liquid material 14 in the measuring hole 31 is caused to flow into the storage container 2 from its lower end after passing through the selector valve 6 and the connection member 13 from the measuring hole 31, as denoted by black arrows in FIG. 3. In this Description, the above-described operation, illustrated in FIG. 3, is called an "inflow operation". During the inflow operation, preferably, the compressed gas is not supplied to the storage container 2 to make the liquid material 14 more easily flow into the storage container 2. In the storage container 2, a flow going upward from below is generated due to the inflow operation. Accordingly, the solid particles deposited in the storage container 2 are move up, thus enabling the liquid material 14 to be stirred. From the viewpoint of causing the liquid material 14 to flow in an amount as large as possible backward to the storage container 2, the plunger 4 is preferably moved downward up to or close to the lower end of the measuring hole 31.

In this Description, a combination of the above-described filling operation (FIG. 2) and the above-described inflow operation (FIG. 3) is called a "stirring" operation. Attention needs to be paid to a point that the position of the selector valve 6 when the plunger 4 is moved downward is different between the stirring operation and the discharge operation. More specifically, in the stirring operation, the selector valve 6 is held at the first position in both the filling operation and the inflow operation, while in the discharge operation the selector valve 6 is set to the first position in the filling operation and to the second position in the discharge operation.

(4) Discharge Control Program

The discharge control program includes a program designed to perform the above-described stirring operation at preset timing (e.g., immediately before the ejection operation, or between one discharge operation and the next discharge operation). In particular, the program is preferably designed to perform the stirring operation at least once before the ejection operation.

The program may be designed to enhance the stirring action by successively performing the stirring operation multiple times and then performing the ejection operation, or to repeatedly perform the stirring operation during a period in which the liquid material is not discharged. In more detail, the discharge control device 10 may include a timer for detecting an event that an operation command is not received for a certain time (e.g., a time at which the problem of deposition of the solid particles may occur, the time being set on the basis of measurements conducted in advance) or longer, and the program may be designed to perform the stirring operation once or multiple times when the lapsed of the certain time is detected by the timer (the timer being implemented with hardware or software).

As an alternative, the program may be designed to detect, at a certain period, timing at which there is a time to perform the stirring operation until the start of the next discharge operation, and to perform the stirring operation once or multiple times at the detected timing regardless of the discharge and other timings.

The program may be designed such that the operations can be performed in succession from the stirring operation to the discharge operation. Because the discharge operation is made by performing the ejection operation after the filling operation and the stirring operation is made by performing the inflow operation after the filling operation, it is disclosed herein, for example, to design the program to perform the discharge operation when a discharge command is received, and to perform the stirring operation when a discharge command is not received. The stirring operation in that case is automatically performed by executing the discharge control program that is stored in the memory of the discharge control device 10.

According to the above-described discharge device 1, the discharge operation and the stirring operation can be selectively performed by changing over the position of one selector valve 6, and a device configuration is simple. In other words, the stirring operation can be performed with a simple device configuration without needing a plurality of valves, a plurality of containers, a pump, a flow adjustment valve, and so on.

Furthermore, the direction of the liquid material flowing through the connection flow passage 131 is reversed between the filling operation and the inflow operation. Thus, since the flow direction in the connection flow passage 131 is not only one, another advantageous effect is obtained in that the solid particles are less apt to deposit in the connection flow passage 131.

Details of the present invention will be described in detail below with reference to Example, but the present invention is in no way limited by the following Example.

EXAMPLE

[A] Discharge Device (A1) Configuration

Figure 5:
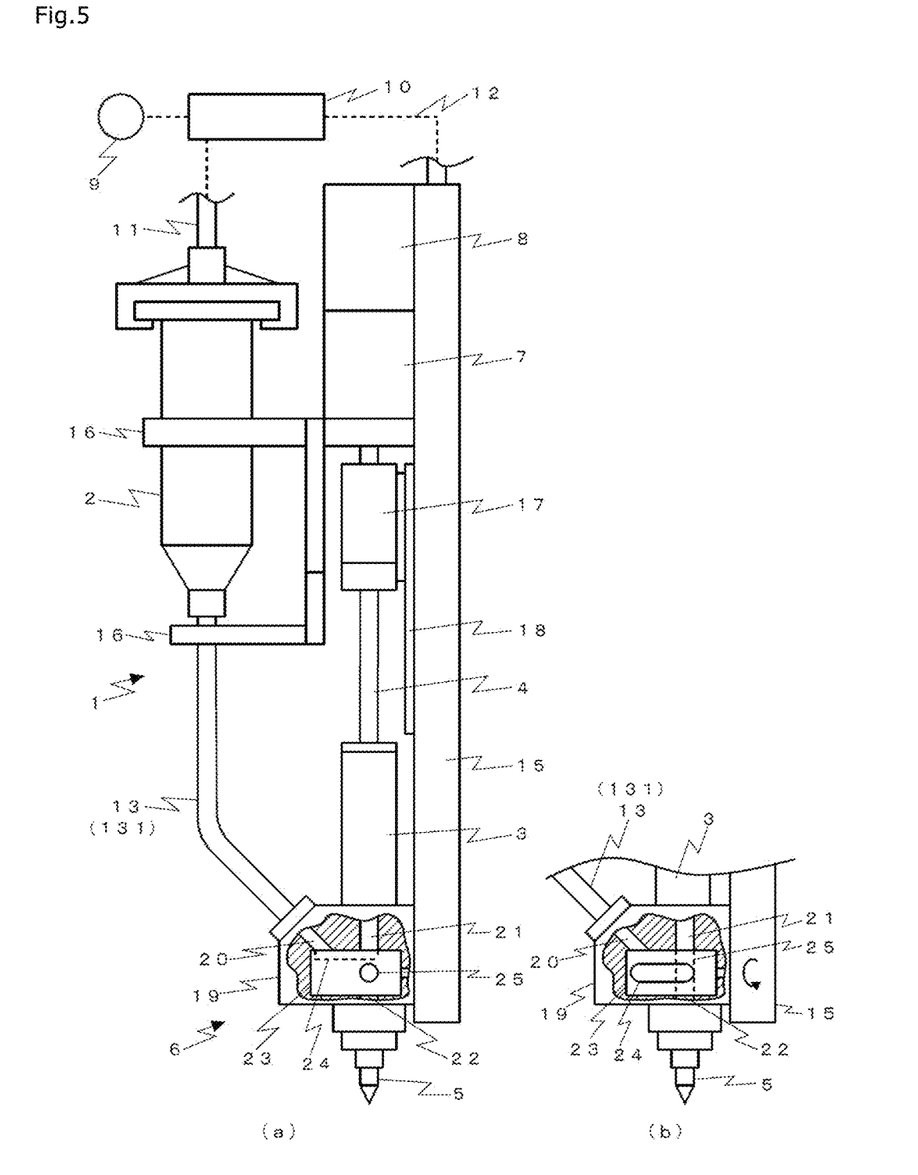
FIG. 5 is a side sectional view of principal part of the discharge device according to Example; specifically, (a) represents the case where a storage container and a measuring unit are communicated with each other, and (b) represents the case where the measuring unit and a nozzle are communicated with each other.

FIG. 5 is a side sectional view of principal part of a discharge device 1 according to Example. In FIG. 5, (a) represents the case where a selector valve 6 is at a first position at which a storage container 2 and a measuring unit 3 are communicated with each other, and (b) represents the case where the selector valve 6 is at a second position at which the measuring unit 3 and a nozzle 5 are communicated with each other. It is to be noted that, in FIG. 5, a hatched region represents a section.

The discharge device 1 according to Example of the present invention includes, as in the above-described embodiment, the storage container 2 in which a liquid material 14 is stored, the measuring unit 3 into which the liquid material 14 is filled, a plunger 4 that is moved forward and backward in the measuring unit 3, a nozzle 5 having a discharge port through which the liquid material 14 is discharged, the selector valve 6 that selectively establishes communication between the storage container 2 and the measuring unit 3 or communication between the measuring unit 3 and the nozzle 5, a plunger drive device 7 that moves the plunger 4 forward and backward, a selector valve drive device 8 that changes over a direction of the selector valve 6, a compressed gas source 9 that supplies a compressed gas to the storage container 2, and a discharge control device 10 that controls operations of the drive devices (7, 8) and a pressure of the compressed gas to be supplied.

In this Example, a syringe serving as a container to store the liquid material 14 is used as the storage container 2. An upper end of the storage container 2 is connected to the compressed gas source 9 through both a tubing 11 and the discharge control device 10 described later, and a lower end of the storage container 2 is connected to a valve block 19 through a connection member 13. The storage container 2 is fixedly held at two locations, i.e., at a lower end and near a center, by a fixing member 16 that extends from a base plate 15. While, in this Example, a syringe is used as a container to store the liquid material 14, the present invention is not limited to such a case. In another example, the storage container 2 may be constituted by a tank or the like that is separately installed near the discharge device 1. While the storage container 2 and the valve block 19 are connected to each other by the connection member 13 in a tubular form, the shape of the connection member 13 is not limited to the tubular form, and the connection member 13 may be constituted as a block-like member including a connection flow passage 131 formed therein.

The measuring unit 3 is formed of a cylindrical member into which the liquid material 14 to be discharged is filled, and the plunger 4 is vertically movable within a measuring hole 31 formed in the measuring unit 3. The plunger 4 is connected to the plunger drive device 7 through a coupling unit 17 such that the plunger 4 can be vertically moved with operation of the plunger drive device 7. Because the coupling unit 17 is fixed to a slide rail 18, the plunger 4 can be smoothly reciprocated without tilting or swinging. In this Example, a linear actuator, for example, is used as the plunger drive device 7. A lower end of the measuring unit 3 is connected to the valve block 19, and the measuring hole 31 is communicated with a second flow passage 21 described below.

In the valve block 19, there are formed a first flow passage 20 in communication with the storage container 2, the second flow passage 21 in communication with the measuring hole 31, and a third flow passage 22 in communication with the nozzle 5. Furthermore, the selector valve 6 for selectively changing over communication between the first flow passage 20 and the second flow passage 21 and communication between the second flow passage 21 and the third flow passage 22 is disposed in the valve block 19.

A valve element 23 in the form of a circular columnar member is disposed inside the selector valve 6. A recessed groove 24 for establishing the communication between the first flow passage 20 and the second flow passage 21 is formed in a surface of the valve element 23 and extends in a direction parallel to a center axis of the valve element 23. In addition, a through-hole 25 is bored in the valve element 23 and penetrates from a one-side lateral surface to an opposite-side lateral surface perpendicularly to the center axis while intersecting the center axis. The valve element 23 is rotated by the selector valve drive device 8 to be changed over between the first position and the second position. The valve element 23 of the selector valve 6 is not limited to the circular columnar member, and it may be of the type sliding a plate-like member in which the recessed groove 24 and the through-hole 25 are formed.

For example, a rotary actuator or a motor is used as the selector valve drive device 8. In this Example, the selector valve drive device 8 and the selector valve 6 are coupled to each other by a not-illustrated power transmission mechanism. Thus, the selector valve drive device 8 can be disposed together with the plunger drive device 7, etc. at a position away from the selector valve 6. Though not illustrated in the drawing, the power transmission mechanism is installed in a groove that is formed in the base plate 15. A chain, a belt, or the like is used as the power transmission mechanism. (A structure adapted for arranging the selector valve drive device and the plunger drive device together with the use of the power transmission mechanism is described in detail in. Patent Document 1 patented to the applicant.) An installation position of the selector valve drive device 8 is not limited to the position described in this Example, and the selector valve drive device 8 may be installed near the selector valve 6 without using the power transmission mechanism to be operated directly by the selector valve drive device 8.

The discharge control device 10 for controlling the operations of the above-described devices and components is connected to the drive devices (7, 8) via control wirings 12. The discharge control device 10 includes a processor and a memory in which a discharge control program is stored. The discharge control device 10 controls a level and an application time of the pressure supplied from the compressed gas source 9, a moving distance and a moving speed of the plunger 4, the changeover of the selector valve 6, etc.

(A2) Operation

The discharge operation and the stirring operation both described in the embodiment are automatically performed by executing the above-described discharge control program. The discharge device 1 of this Example is able to automatically perform a discharge operation and a stirring operation similar to those described above in the embodiment.

(A3) Usage

The discharge device and method of this Example are used in a step of applying a liquid material containing solid particles with a higher specific gravity than that of the liquid material, e.g., a step of applying, onto an LED element, a liquid material mixed with phosphors (that correspond to the solid particles). The liquid material used in the application step for the LED element is, for example, an epoxy resin, a silicone resin, or an acrylic resin. The phosphors are, for example, nitride-, oxynitride-, oxide-, and sulfide-based phosphors. Practical examples of the phosphors are a YAG-based phosphor (chemical formula of $Y_3Al_5O_{12}$:Ce) that is a yellow phosphor obtained by mixing, to a garnet-structure crystal made of a composite oxide of yttrium and aluminum, another element, a LuAG-based phosphor that is a green phosphor expressed by the chemical formula of $Lu_3Al_5O_{12}$:Ce, a SCASN-based phosphor that is a red phosphor expressed by the chemical Formula of $(Sr,Ca)AlSiN_3$:Eu, a CASN-based phosphor that is a red phosphor expressed by the chemical formula of $CaAlSiN_3$:Eu, a LSN-based phosphor that is a yellow phosphor expressed by the chemical formula of $La_3Si_6N_{11}$:Ce, a scandium oxide phosphor that is a green phosphor expressed by the chemical formula, of $CaSc_2O_4$:Ce, and a sialon-based phosphor that is a green phosphor expressed by the chemical formula of SiAlON:Eu.

[B] Application Device

Figure 6:
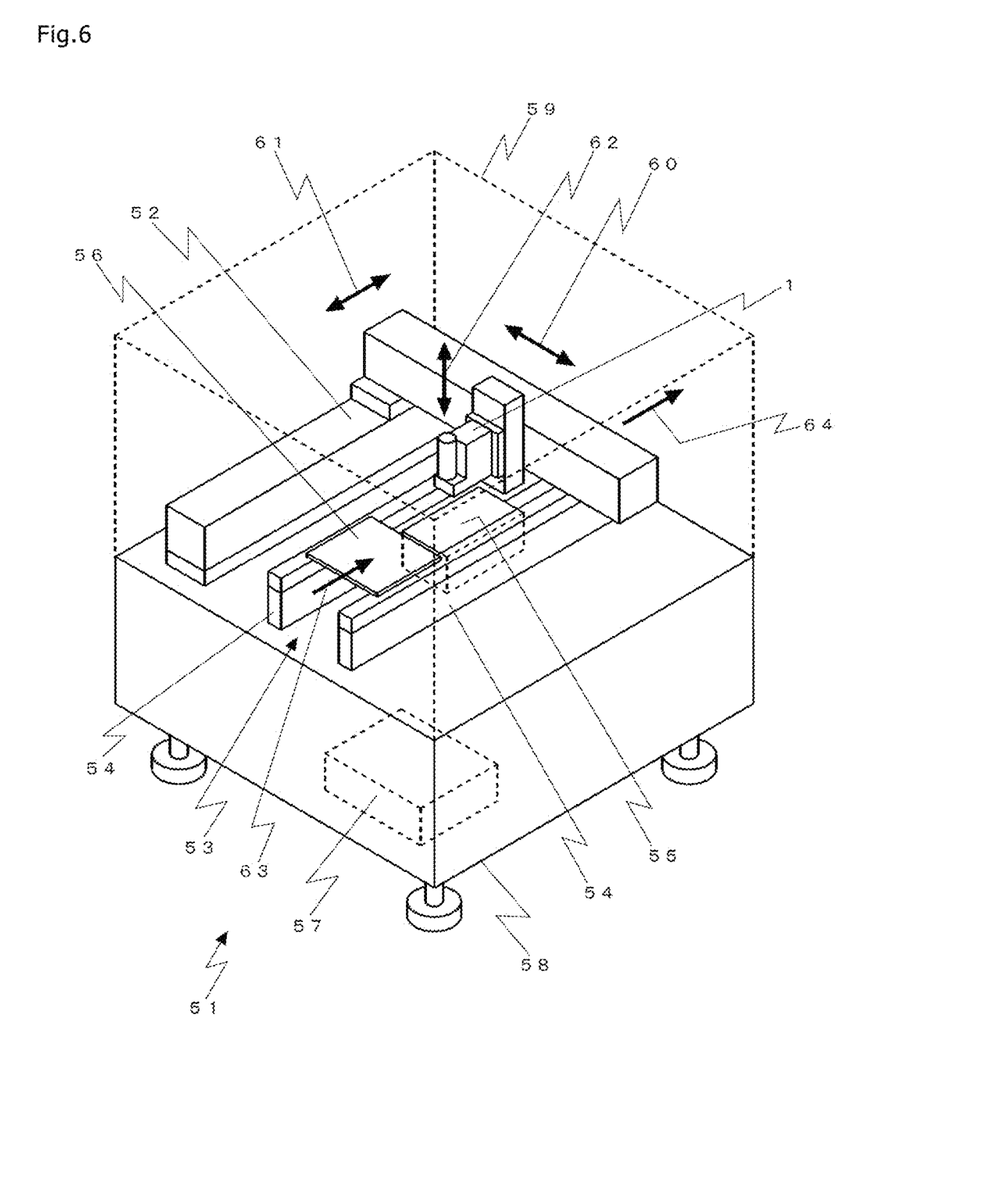
FIG. 6 is a schematic perspective view of an application device according to Example.

The discharge device 1 is mounted to an application device 51, and it performs application work onto a workpiece 56. FIG. 6 is a schematic perspective view of the application device 51 according to Example.

(B1) Configuration

The application device 51 according to Example of the present invention is mainly constituted by the above-described discharge device 1, an XYZ drive mechanism 52 that moves the workpiece 56, i.e., a target to which the liquid material 14 is discharged, and the above-described discharge device 1 relatively to each other, a conveying mechanism 53 that carries in the workpiece 56 from the outside of the application device 51, moves the workpiece 56 to an application work position, and that carries out the workpiece 56 to the outside of the application device 51, a stage 55 that fixedly supports the workpiece 56 during the application work, and an application control device 57 that controls operations of the above-mentioned devices and components.

The discharge device 1 is installed on the XYZ drive mechanism 52 and is able to move, relative to the workpiece 56, in each of directions (i.e., an X moving direction 60, a Y moving direction 61, and a Z moving direction 62) denoted by individual arrows. While, in this Example, the discharge device 1 is constituted to be movable in the XYZ directions, the present invention is not limited to such a case. It is just needed that the discharge device 1 and the workpiece 56 can be moved relatively to each other. In another example, the discharge device 1 may be constituted to be movable only in the Z direction, and the stage 55 may be constituted to be movable in the XY directions. For example, a combination of a servo motor or a stepping motor and a ball screw, or a linear motor can be used as the XYZ drive mechanism 52.

The application device 51 of this Example includes the conveying mechanism 53 for transferring the workpiece to and from not-illustrated devices in preceding and succeeding steps or loader/unloader. The conveying mechanism 53 has a structure in which two rail-like members 54 are installed parallel to each other in substantially the same width as that of the workpiece 56 to be conveyed, and not-illustrated belts are disposed on the rail-like members 54 to circulate with the aid of not-illustrated rollers. When the rollers are rotated by a motor, for example, the belt is circulated and the workpiece 56 placed on the belt is conveyed in a direction (i.e., a carrying-in direction 63 or a carrying-out direction 64) denoted by an arrow. Thus, ends of the rail-like members 54 as viewed along a direction opposite to the carrying-in direction 63 constitute a carrying-in zone, and ends of the rail-like members 54 as viewed along the same direction as the carrying-in direction 63 constitute a carrying-out zone. Instead of using the above-described belts, a robot having an arm may be used, as the conveying mechanism 53, to transfer a substrate.

The stage 55 is disposed between the two rail-like members 54 of the conveying mechanism 53. The stage 55 takes an elevated position where it fixedly supports the workpiece 56 while elevating the workpiece 56 stopped at a working position from below, and a lowered position where it is located away from the workpiece 56 not to interfere with the workpiece 56 when the workpiece 56 is transferred. For example, a combination of a motor and a ball screw, or an air cylinder can be used as a device for elevating and lowering the stage 55. The workpiece 56 can be fixed onto the stage 55 by a method of attracting the workpiece 56 to be fixedly kept in place by boring a plurality of holes extending from the inside of the stage 55 to an upper surface thereof, and sucking air through the holes, a method of fixing the workpiece 56 by holding the workpiece 56 between fixing members, and fixating those members to the stage 55 with fixation means such as screws, or a method of fixedly sandwiching the workpiece 56 between a not-illustrated retainer included in the conveying mechanism 53 and the stage 55 at the elevated position of the stage 55.

The XYZ drive mechanism 52, the conveying mechanism 53, and the stage 55 are disposed on a bench 58, and their surroundings are covered with a cover 59 denoted by dotted lines. Covering with the cover 59 prevents intrusion of dust from the outside and secures safety of workers. Though not illustrated, however, openings through which the workpiece 56 is carried in and out are formed at positions corresponding to the carrying-in side and the carrying-out side of the conveying mechanism 53. The discharge control device 10 may be installed inside the bench 58 though not illustrated in FIG. 6.

The application control device 57 for controlling the operations of the above-described devices and components includes a processor and a memory in which an application control program is stored. As denoted by dotted lines, the application control device 57 is installed inside the bench 58. Application pattern data necessary for performing the application work is stored in the memory of the application control device 57. The application control device 57 performs the above-described stirring work at the predetermined timing in cooperation with the discharge control device 10. The cooperation between the application control device 57 and the discharge control device 10 is made in such a manner that the discharge control device 10 controls the operations of the devices and components, which are required for the operations of the discharge device 1 to perform the discharge work and the stirring work, and that the application control device 57 instructs, for example, the timings of performing the discharge work and the stirring work, to the discharge control device 10.

Figure 7:
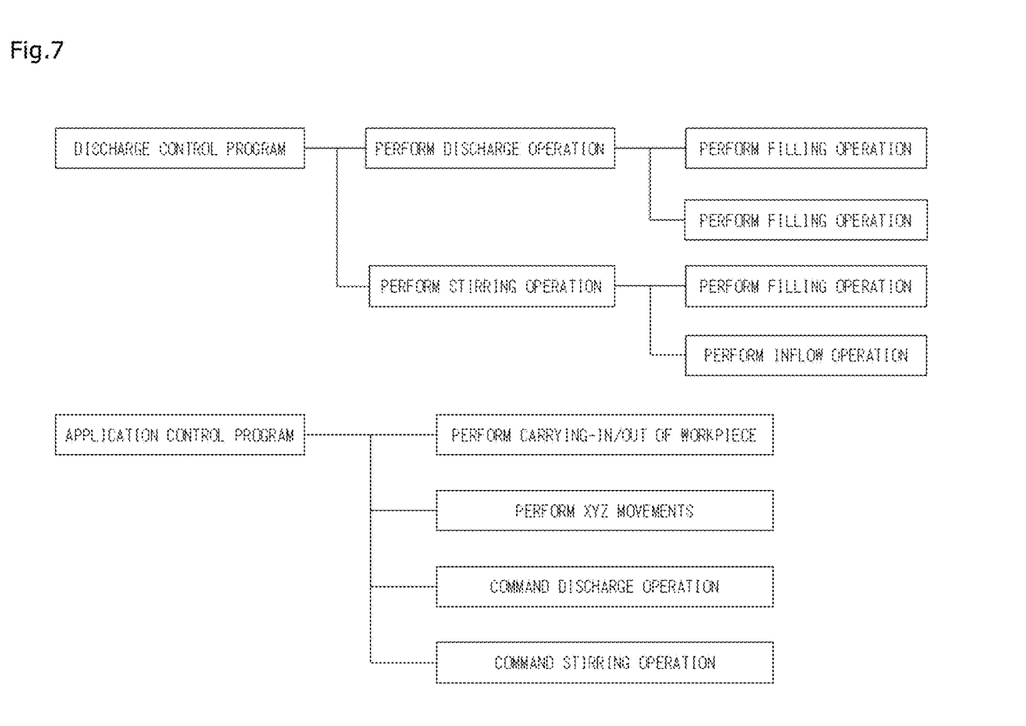
FIG. 7 is a block diagram illustrating individual modules of a discharge program and an application control program according to Example.

FIG. 7 is a block diagram illustrating individual modules of a discharge program and an application control program according to Example. The application control program sends a stirring operation command to the discharge control program at the following timings, for example:

(a) At the start of carrying-in and carrying-out of the workpiece (b) At the timing when the discharge device is moved in the XYZ directions without performing the discharge (e.g., when the discharge device is moved from a standby position to an application start position)

(c) At the timing after the lapse of a certain time (e.g., a time at which the problem of deposition of the solid particles may occur, the time being set on the basis of measurements conducted in advance) from the last discharge operation command or stirring operation command, and when neither discharge operation command nor the stirring operation command is issued.

In the case of above (c), a timer for detecting the lapse of the certain time may be equipped in the application control device 57, and the program may be designed to perform the stirring operation once or multiple times when the timer detects the lapse of the certain time (the timer being implemented using hardware or software).

(B2) Operation

In the above-described application device 51, the following application operation is performed in accordance with the application control program.

When the application control program is executed, the workpiece 56 is carried into the cover 59 of the application device 51 by the conveying mechanism 53 that conveys the workpiece 56 in a first direction. The workpiece 56 having been carried into the cover 59 is continuously conveyed in the first direction and is stopped upon arriving at the position (working position) where the stage 55 is installed. When the workpiece 56 is stopped, the stage 55 is elevated to fixedly support the workpiece 56. After the workpiece 56 has been fixedly supported by the stage 55, desired application work is performed by continuously discharging the liquid material 14 onto the workpiece 56 in accordance with a preset application pattern while the discharge device 1 is moved relative to the workpiece 56 by the XYZ drive mechanism 52. The wording "application pattern" used here includes, for example, the case of filling the liquid material into a region defined by dam in a state that the discharge port is stopped at a predetermined position after being moved there.

When the discharge device 1 finishes the application work on the workpiece 56, the workpiece 56 is released from the fixed state, moved to the carrying-out side by the conveying mechanism 53, and then carried out to the outside of the cover 59 of the application device 51. The foregoing is a basic flow of the application work performed on one workpiece 56. When performing the application work on a plurality of workpieces 56, programming is made to repeat the above-mentioned series of works (carrying-in of the workpiece, application, and carrying-out of the workpiece).

In the application device 51 of this Example, there is timing at which the discharge operation is not performed (or rather cannot be performed), such as a period of carrying in or out the workpiece 56. Thus, the application control program is designed to perform the stirring operation by utilizing that timing at which the discharge operation is not performed (or rather cannot be performed). For example, the period of carrying in the workpiece 56 is immediately before the application operation (discharge operation). Therefore, by designing the program to perform the stirring operation in the period of carrying in the workpiece 56, the liquid material can be discharged in a state of the solid particles being dispersed in the liquid material, and a maximum effect is obtained. Even when the application work is performed on only one workpiece 56, the timing to perform the stirring operation is not missed by designing the program to perform the stirring operation in the period of carrying in the workpiece 56. When the application work is performed on a plurality of workpieces 56, the program may be designed to perform the stirring operation in the period of carrying out the workpiece 56. The stirring operation may be performed in a period between carrying-out of one workpiece 56 and carrying-in of the next workpiece 56. Furthermore, the program may be designed to perform the stirring operation in a period in which the workpiece 56 is not carried in, such as a standby period.

Thus, the application work can be always performed in the state of the solid particles being dispersed in the liquid, by sending the command for the stirring operation to the discharge control device 10 in accordance with the application control program in the period of carrying in or out the workpiece 56.

LIST OF REFERENCE SIGNS

1: discharge device 2: storage container (syringe), 3: measuring unit, 4: plunger, 5: nozzle, 6: selector valve, 7: plunger drive device, 8: selector valve drive device, 9: compressed gas source, 10: discharge control device, 11: tubing, 12: control wiring, 13: connection member, 14: liquid material, 15: base plate, 16: fixing member, 17: coupling portion, 18: slide rail, 19: valve block, 20: first flow passage, 21: second flow passage, 22: third flow passage, 23: valve element, 24: groove, 25: through-hole, 31: measuring hole, 51: application device, 52: XYZ drive mechanism, 53: conveying mechanism, 54: rail-like member, 55: stage, 56: workpiece, 57: application control device, 58: bench, 59: cover, 60: X moving direction, 61: Y moving direction, 62: Z moving direction, 63: carrying-in direction, 64: carrying-out direction, 131: connection flow passage, 132: connection portion

The invention claimed is:

1. A discharge device for a liquid material containing solid particles, the discharge device comprising:
    a storage container in which the liquid material containing solid particles is stored;
    a measuring unit having a measuring hole into which the liquid material is filled;
    a plunger that is moved forward and backward in the measuring hole;
    a nozzle having a discharge port through which the liquid material is discharged;
    a selector valve having a first position at which the storage container and the measuring unit are communicated with each other, and a second position at which the measuring unit and the nozzle are communicated with each other;
    a plunger drive device that moves the plunger forward and backward;
    a selector valve drive device that changes over the first position and the second position of the selector valve; and
    a discharge control device including a processor and a memory in which a discharge control program is stored,
    wherein the discharge control program includes:
    a filling step of operating the selector valve to the first position, moving the plunger backward, and filling the liquid material into the measuring hole;
    an ejection step of operating the selector valve to the second position, moving the plunger forward, and discharging the liquid material in the measuring hole from the discharge port;
    an inflow step of operating the selector valve to the first position, moving the plunger forward, and causing the liquid material in the measuring hole to flow into the storage container;
    a discharge step of successively executing the filling step and the ejection step; and
    a stirring step of successively executing the filling step and the inflow step,
    wherein the discharge device further comprises a compressed gas source that is configured to supply a compressed gas under pressure adjusted by the discharge control device to the storage container through a tubing.

2. The discharge device for the liquid material containing solid particles according to claim 1, wherein the discharge control program includes a continuous stirring step of continuously performing the stirring step.

3. The discharge device for the liquid material containing solid particles according to claim 1, further comprising a connection member including a connection flow passage that communicates the storage container and the measuring unit with each other, wherein a cross-sectional area of a connection portion between the connection flow passage and the storage container is ¼ or less of a cross-sectional area of the storage container.

4. The discharge device for the liquid material containing solid particles according to claim 3, wherein the cross-sectional area of the connection portion between the connection flow passage and the storage container is 1/10 or less of the cross-sectional area of the storage container.

5. The discharge device for the liquid material containing solid particles according to claim 3, wherein the connection flow passage is formed of a linear flow passage having substantially the same diameter from one end to the other end.

6. The discharge device for the liquid material containing solid particles according to claim 1, wherein the compressed gas under pressure adjusted by the discharge control device is not supplied to the storage container in the inflow step.

\* \* \* \* \*